(12) United States Patent
Reblewski et al.

(10) Patent No.: US 6,647,362 B1
(45) Date of Patent: Nov. 11, 2003

(54) EMULATION SYSTEM SCALING

(76) Inventors: Frederic Reblewski, 2 rue Antoine Roucher, 75016 Paris (FR); Jean Barbier, 43 rue Gay-Iussac, 92320 Chatillon (FR); Olivier Lepape, 2 rue Antoine Roucher, 75016 Paris (FR)

( * ) Notice: Subject to any disclaimer, the term of this patent is extended or adjusted under 35 U.S.C. 154(b) by 0 days.

(21) Appl. No.: 09/405,602

(22) Filed: Sep. 24, 1999

(51) Int. Cl.$^7$ .............................................. G06F 9/455
(52) U.S. Cl. ........................................ 703/28; 716/12
(58) Field of Search .................. 703/23–28; 716/12–16

(56) References Cited

U.S. PATENT DOCUMENTS

| | | | |
|---|---|---|---|
| 4,914,612 A | 4/1990 | Beece et al. .................. | 703/15 |
| 5,036,473 A | 7/1991 | Butts et al. .................. | 703/23 |
| 5,282,271 A | 1/1994 | Hsieh et al. .................. | 326/38 |
| 5,352,123 A | 10/1994 | Sample et al. ................ | 439/61 |
| 5,424,589 A | 6/1995 | Dobbelaere et al. .......... | 326/41 |
| 5,574,388 A | 11/1996 | Barbier et al. ................ | 326/41 |
| 5,604,888 A | 2/1997 | Kiani-Shabestari et al. ... | 703/23 |
| 5,682,107 A | 10/1997 | Tavana et al. ................ | 326/41 |
| 5,838,908 A | * 11/1998 | Matzke et al. ................ | 703/23 |
| 5,903,744 A | 5/1999 | Tseng et al. .................. | 716/16 |
| 5,907,697 A | 5/1999 | Barbier et al. ................ | 716/16 |

FOREIGN PATENT DOCUMENTS

| | | |
|---|---|---|
| JP | 02-12343 | 1/1990 |
| JP | 06-334368 | 12/1994 |

OTHER PUBLICATIONS

Ejnioui et al, "Multi–Terminal Net Routing for Partial Crossbar–Based Multi–FPGA Systems", Proceedings of the 1999 ACM/SIGDA 7th International Symposium on Field Programmable Gate Arrays, pp. 176–185 (1999).*

Berger, "Teramac HW Simulator System External Reference Specification," Nov. 7, 1991, Revision 1.1, pp. 3–37.

Meta Systems Series 100, Meta Systems—Brochure, Mar 14, 1994, pp. 1–4.

Snider et al., "The Teramac Configuarble Compute Engine," Field Programmable Logic and Applications, $5^{th}$ International Workshop, FPL '95 Oxford, United Kingdom, pp. 44–53.

Snider, "Testing Teramac Interchip Connectivity," Jul. 1, 1993, pp. 1–8.

Snider, "The Teramac Compiler," Nov. 29, 1993, pp. 1–51.

Xilinx, "The Progammable Gate Array Design Handbook," First Edition, 1986, pp. i–A–10.

"Translation of an Office Action of Japanese Patent Office," from a Japanese counterpart application, 3 pp., Apr. 23, 2002.

Office Action of Japanese Patent Office, from a Japanese counterpart application, 2 pp., Apr. 23, 2002.

* cited by examiner

*Primary Examiner*—Samuel Broda
(74) *Attorney, Agent, or Firm*—Banner & Witcoff, Ltd.

(57) ABSTRACT

A scalable emulation system is disclosed. The basic embodiment of the emulation system includes a number of logic boards with logic chips that are reconfigurable to emulate circuit elements of a circuit design. The basic embodiment further includes a number of interconnect boards coupled to at least the logic boards. Each of the interconnect boards includes interconnect chips that are reconfigurable to selectively interconnect the logic chips of different ones of the logic boards. Additionally, at least each of a subset of the interconnect boards includes a number of expansion connectors for facilitating expansion of the emulation system in one or more selected ones of expansion orientations through coupling of at least one or more substantial replicates of the basic embodiment.

42 Claims, 9 Drawing Sheets

EMULATION SYSTEM SCALING

BACKGROUND OF THE INVENTION

1. Field of the Invention

The present invention pertains to the field of circuit design emulation. More particularly, this invention relates to the subject of scaling an emulation system.

2. Background

With advances in integrated circuit technology, various tools have been developed to aid circuit designers in designing and debugging highly complex integrated circuits. In particular, emulation systems comprising reconfigurable emulation resources such as reconfigurable logic chips, reconfigurable interconnects, and so forth, have been developed for circuit designers to quickly "realize" their designs and emulate operation of the circuits.

Great advances have been made in the art of sub-micron integration in recent years, resulting in significantly more complex integrated circuits are being designed. In turn, it has become necessary for emulation system manufacturers to supply very large emulation systems capable of emulating these highly complex integrated circuits. At the same time, since it has become possible to integrate an entire system on a chip, increasingly, at the other end of the spectrum, ASIC designers are turning to pre-designed function blocks, allowing the ASIC designers to concentrate on the design of the incremental custom logic, which often constitutes only a small portion of the whole chip. As a result, a need also exists for the emulation system manufacturers to provide small to medium size emulation systems for these ASIC designers. In between, various sizes of emulation systems are desired. In order for an emulation manufacturer to be able to meet this increasingly wide range of capability demands in a cost effective and efficient manner, it has become highly desirable for an emulation system manufacturer to be able to flexibly scale and package emulation systems of different sizes from fundamentally the same architecture.

SUMMARY OF THE INVENTION

A scalable emulation system is disclosed. The basic embodiment of the emulation system includes a number of logic boards with logic chips that are reconfigurable to emulate circuit elements of a circuit design. The basic embodiment further includes a number of interconnect boards coupled to at least the logic boards. Each of the interconnect boards includes interconnect chips that are reconfigurable to selectively interconnect the logic chips of different ones of the logic boards. Additionally, at least each of a subset of the interconnect boards includes a number of expansion connectors for facilitating expansion of the emulation system in one or more selected ones of expansion orientations through coupling of at least one or more substantial replicates of the basic embodiment.

BRIEF DESCRIPTION OF THE DRAWINGS

The present invention is illustrated by way of example and not limitation in the figures of the accompanying drawings, in which like references indicate similar elements and in which.

DETAILED DESCRIPTION

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details. In other instances, well known features are omitted or simplified in order not to obscure the present invention.

Parts of the description will be presented in terms of operations performed by a computer system, using terms such as data, flags, bits, values, characters, strings, numbers and the like, consistent with the manner commonly employed by those skilled in the art to convey the substance of their work to others skilled in the art. As well understood by those skilled in the art, these quantities take the form of electrical, magnetic, or optical signals capable of being stored, transferred, combined, and otherwise manipulated through mechanical and electrical components of the computer system; and the term computer system include general purpose as well as special purpose data processing machines, systems, and the like, that are standalone, adjunct or embedded.

Various operations will be described as multiple discrete steps in turn, in a manner that is most helpful in understanding the present invention, however, the order of description should not be construed as to imply that these operations are necessarily order dependent. In particular, these operations need not be performed in the order of presentation.

Figure 1:
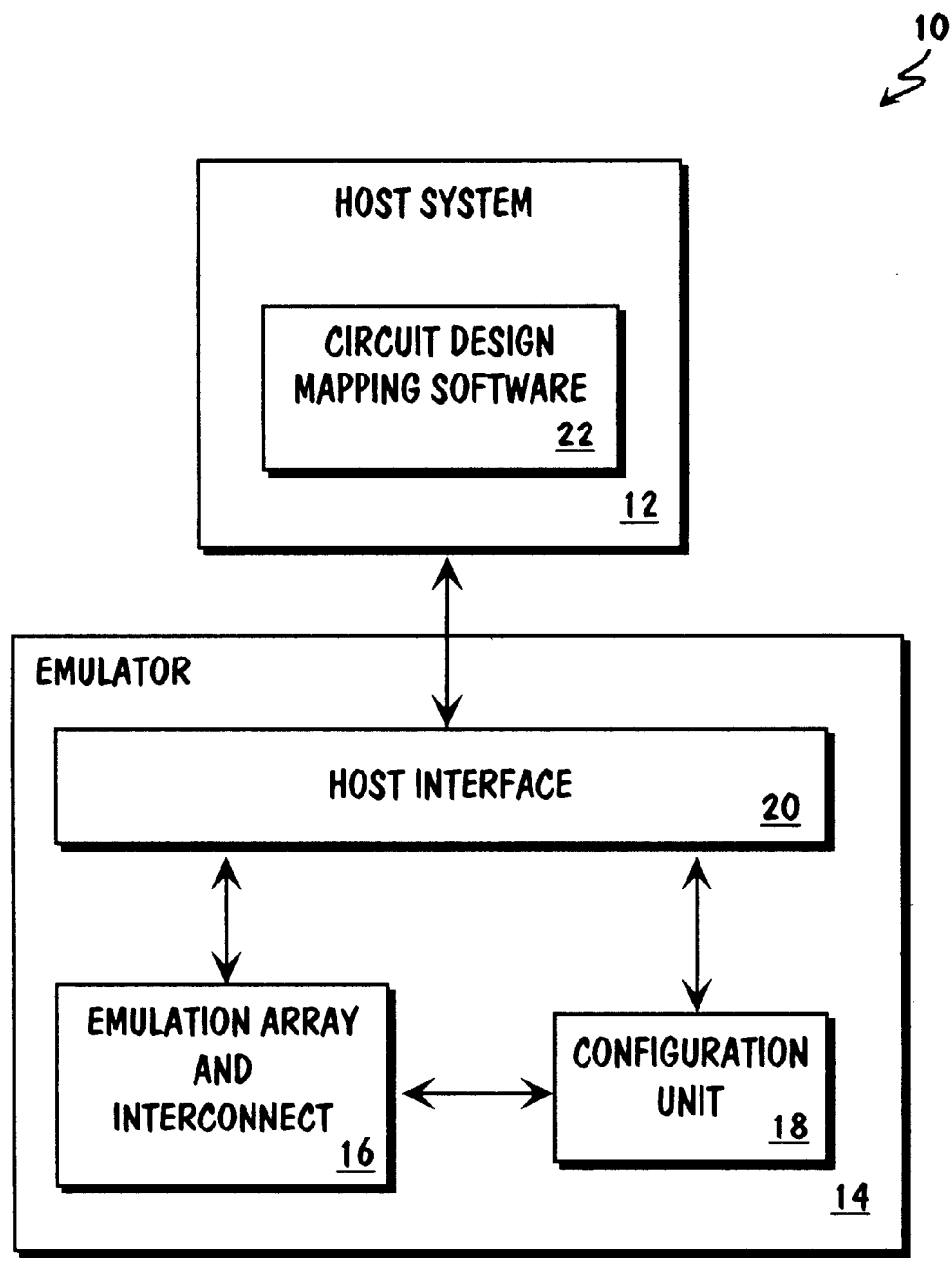
FIG. 1 is a block diagram showing an exemplary emulation system incorporated with the scaling teachings of the present invention.

Referring now to FIG. 1, wherein a block diagram illustrating an exemplary emulation system incorporated with the scaling teachings of the present invention is shown. As illustrated, emulation system 10 includes host system 12 and scalable emulator 14. Host system 12 includes in particular circuit design mapping software 22, whereas scalable emulator 14 includes configuration unit 18, host interface 20, and scalable emulation resources, denoted as emulation array and interconnect 16, packaged in accordance with the scaling teachings of the present invention, allowing embodiments of different sizes to be cost effectively and efficiently manufactured from essentially the same architecture. Furthermore, the embodiments are transparent to mapping software 22, and particularly suitable for emulation resource sharing, to be described more fully below.

Host system 12, including circuit design mapping software 22, is intended to represent a broad category of host systems found in conventional emulation systems, including elements such as processor, memory, storage medium, and so forth (not shown) for storing and executing circuit design mapping software 22, which typically includes functions for reading and partitioning formally represented circuit designs, generating netlists and then configuration information for the partitioned circuit designs, and so forth. Mapping software 22 may be pre-installed or field installed on host system 12. Thus, host system 12, including mapping software 22, will not be otherwise further described.

Configuration unit 18 and host interface 20 of scalable emulator 14 perform their conventional functions, and they too are conventionally constituted. Thus, configuration unit 18 and host interface 20 will not be further described either. Emulation resources of emulation array and interconnect 16 also perform their conventional functions, however, they are equipped, inter-coupled and physically disposed in a manner that facilitates scaling of emulator 14 in one or more selected ones of a number of scaling orientations.

Figure 2:
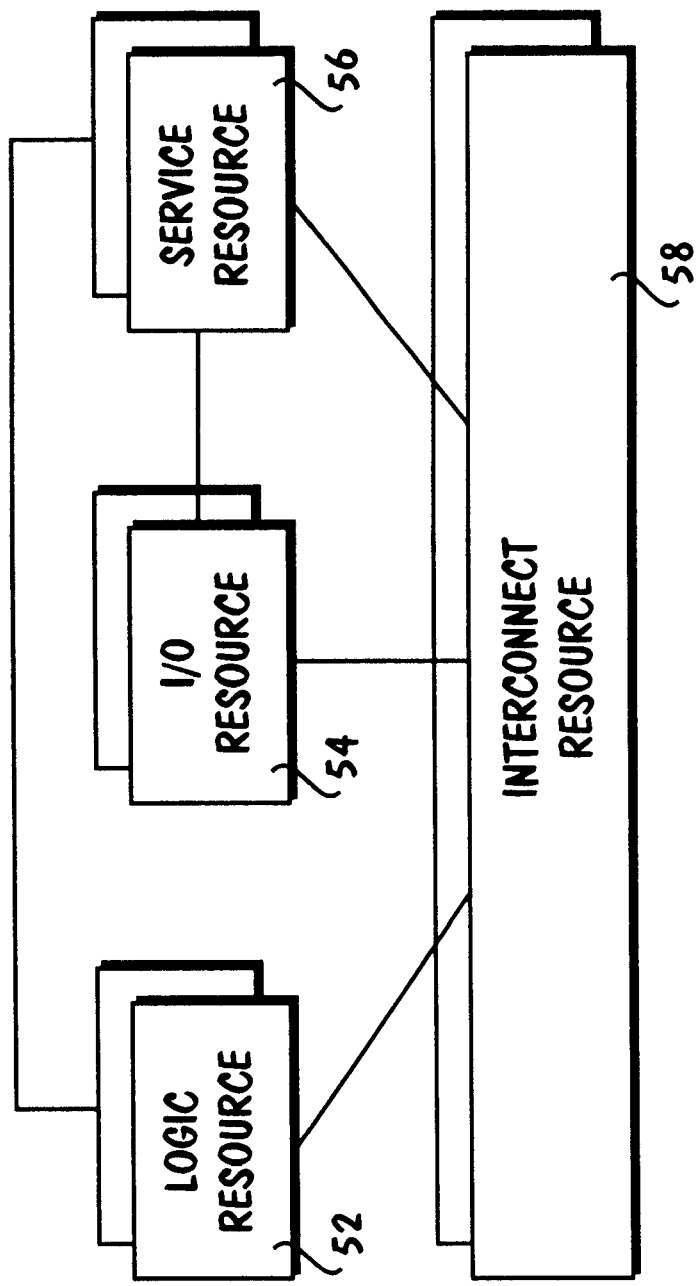
FIG. 2 is a block diagram showing the emulation resources of the scalable emulator of FIG. 1 in further details.

FIG. 2 illustrates emulation resources of emulation array and interconnect 16 in further detail. Emulation resources of emulation array and interconnect 16 include reconfigurable logic resources 52, I/O resources 54 and service resources 56, interconnected by reconfigurable interconnects 58. In one embodiment, the reconfigurable logic resources 52 are reconfigurable logic chips distributively disposed on a number of logic boards. Similarly, I/O resources 54 and service resources 56 are distributively disposed on I/O and service boards respectively. In one embodiment, reconfigurable interconnects 58 are distributively packaged into interconnect chips (also referred to as routing chips), and in turn into interconnect boards. The logic boards, I/O boards and service boards are interconnected by the interconnect boards, and distributively packaged in accordance with the scaling teachings of the present invention, which as described earlier, provides for scaling in one or more selected ones of a number of scaling orientations.

Figure 3:
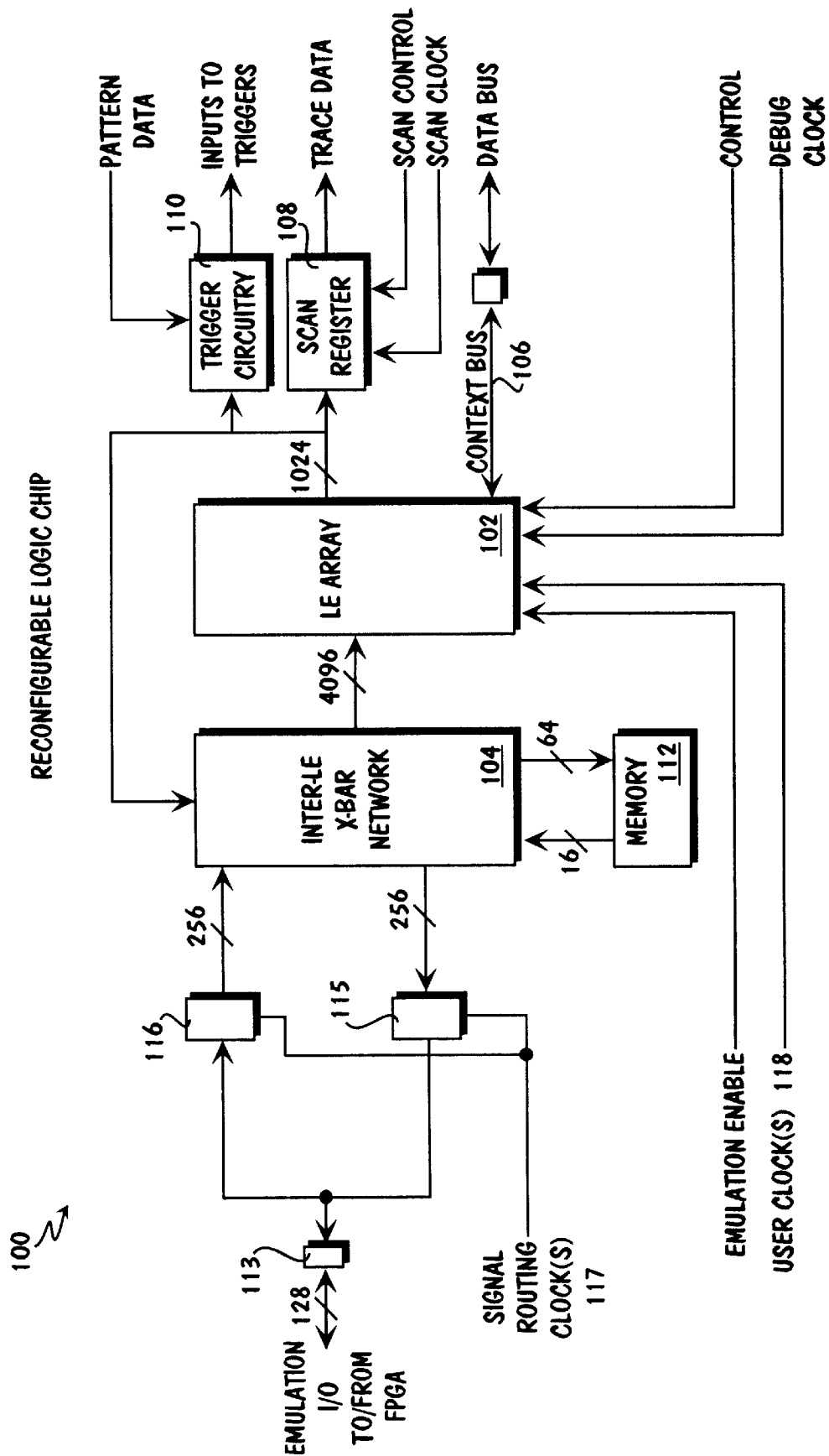
FIG. 3 is a block diagram showing one embodiment of a logic chip suitable for use in the scalable emulator of the present invention.

FIG. 3 illustrates one embodiment of a reconfigurable logic chip suitable for use to form scalable emulator 14 in accordance with the scaling teachings of the present invention. For the illustrated embodiment, logic chip 100 is a custom or special purpose logic chip. Logic chip 100 is equipped to enable mapping software 22 to confine emulation signal fan outs to inside logic chip 100 to improve emulation signal routing. As illustrated, logic chip 100 includes reconfigurable logic element (LE) array 102, on-chip interconnect network 104 and buffered I/O pins 113 having associated multiplexing circuitry 115 and 116, coupled to each other as shown. LE array 102 includes multiple reconfigurable LEs clocked by user clock(s) 118. Reconfigurable LEs are used to "realize" various logic elements of circuit designs. On-chip interconnect network 104 is used to facilitate on-chip emulation signal routing between e.g. LEs or LE and buffered I/O pins 113. Buffered I/O pins 113 are used to provide time multiplexed input/output of emulation signals to/from logic chip 100. Additionally, logic chip 100 includes memory 112, context bus 106, scan register 108, and trigger circuitry 110. Memory 112 facilitates usage of logic chip 100 to emulate circuit design with memory elements. Context bus 106, scan register 108 and trigger circuitry 110 provide on-chip integrated debugging facility for logic chip 100. Mapping software 22, when interconnecting allocated logic resources of emulation system 10, leverages on the time multiplexing input/output ability of logic chip 100 and confines all emulation signal fan outs within logic chip 100. In alternate embodiments, other general or special purpose reconfigurable logic chips, such as conventional field programmable gate array (FPGA) may be employed instead.

Figure 4:
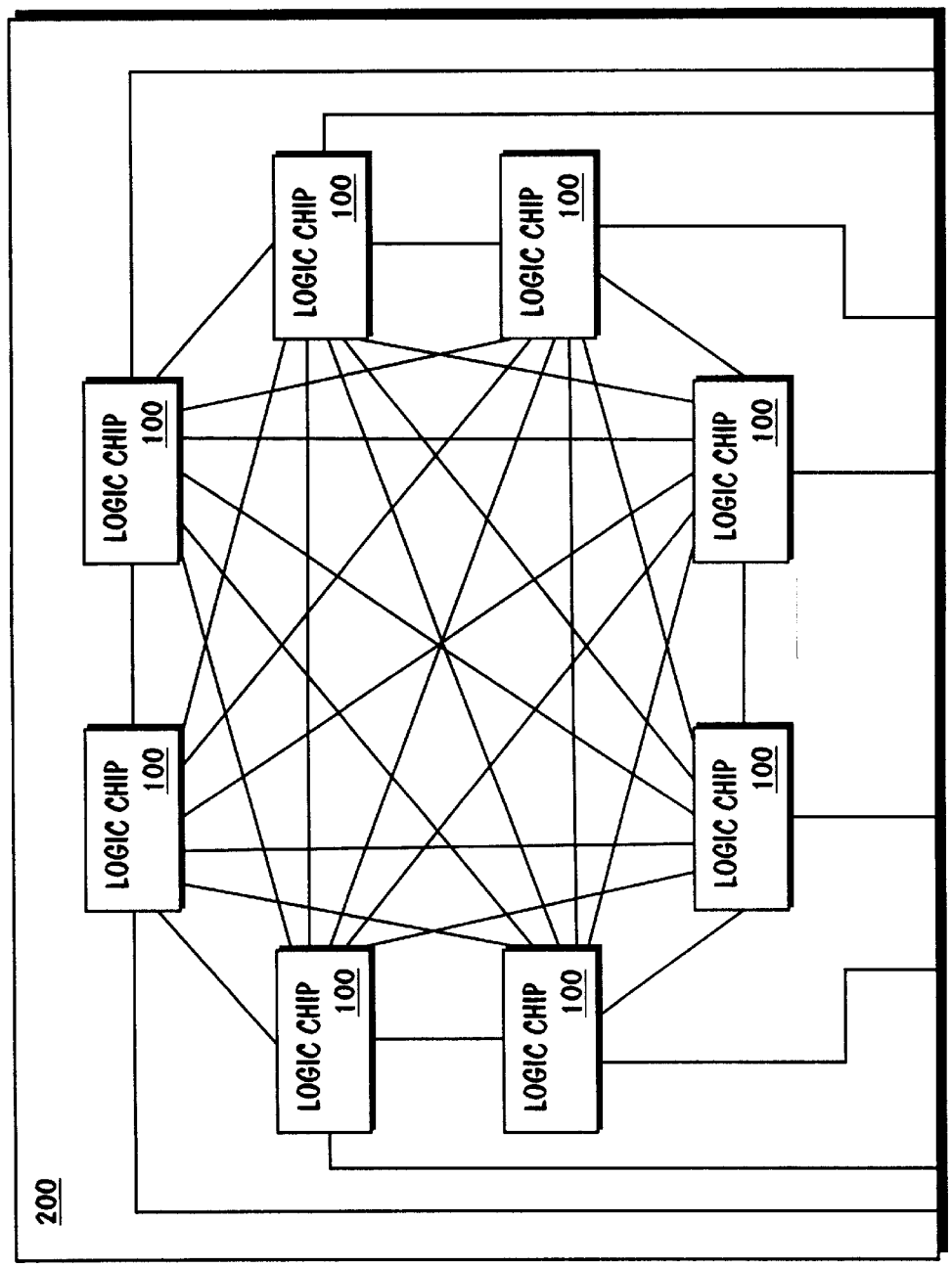
FIG. 4 is a block diagram illustrating one embodiment of a logic board suitable for use to distributively package the logic chips.

FIG. 4 illustrates one embodiment of a logic board suitable for distributively packaging the above described logic chips to form scalable emulator 14 in accordance with the scaling teachings of the present invention. As shown, each logic board 200 includes a number of logic chips 100 described earlier. For the illustrated embodiment, logic chips 100 of the same logic board 200 are directly and fully interconnected with one another, to provide deterministic timing delay within the logic board for emulation signal routing between the logic chips 100 of the same logic board 200. Each "direct connection" includes multiple direction connections between I/O pins of two logic chips 100. The number of direct connections provided between any two logic chips is application dependent, depending on the number of I/O pins available per logic chip, and the number of logic chips included in each logic board. Mapping software 22 when interconnecting allocated logic resources, further advantageously leverages on the fully interconnected architecture of logic board 200 and confines all inter-logic chip emulation signal routing between logic chips 100 of logic board 200 to the direct connections between them. In alternate embodiments, other board level interconnect architecture, e.g. a partial interconnect or a nearest neighbor interconnect architecture, may be employed for logic board 200 instead.

Figure 5:
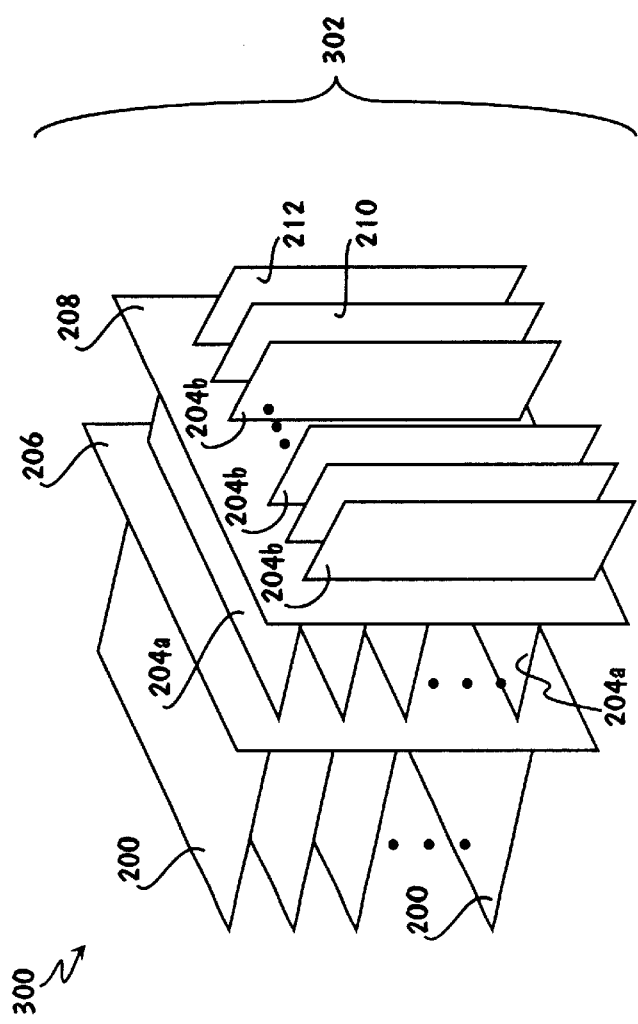
FIG. 5 is a perspective view of a basic embodiment of the emulator of the present invention.

FIG. 5 illustrates a basic embodiment of scalable emulator 14. For the illustrated embodiment, basic embodiment of emulator 14 is formed with emulation resources inter-coupled and physically disposed in half of a crate; more specifically, in the top half of crate 300. Logic boards 200 are horizontally disposed. Logic chips 100 of logic boards 200 are reconfigurably interconnected together by interconnect chips (not shown) of interconnect boards 204a and 204b. Interconnect boards 204a are correspondingly coupled to logic boards 200 through connectors (not shown) disposed on backplane 206. Interconnect boards 204b in turn are orthogonally interconnected to interconnect boards 204a through connectors (not shown) disposed on backplane 208. I/O and service boards 210 and 212 are also orgthogonally interconnected to interconnect boards 204a as shown. Each of interconnect boards 204b includes in particular expansion connectors (not shown) for facilitating scaling of emulator 14 in one or more selected ones of a number of scaling orientations through coupling of one or more substantial replicates of basic embodiment 302 to basic embodiment 302.

Figure 6:
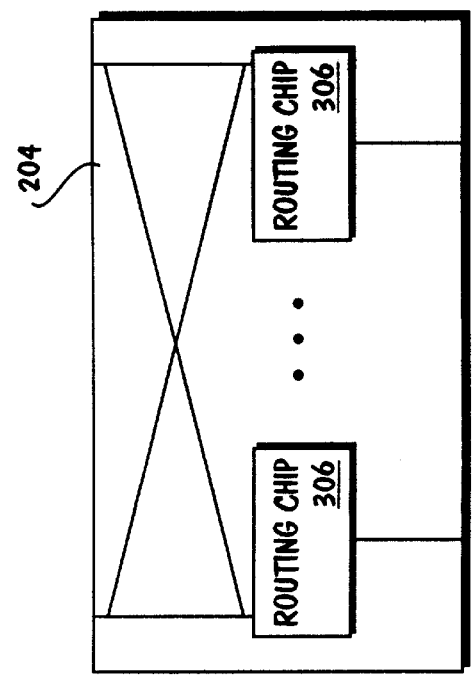
FIG. 6 is a block diagram illustrating a generic embodiment of an interconnect board suitable for use in the scalable emulator of the present invention.

FIG. 6 illustrates a generic embodiment of an interconnect board 204. As shown, each interconnect board 204 includes a number of emulation signal routing chip 306. Interconnect boards 204a and 204b of FIG. 5 differ from each other only in terms of the number routing chips 306 included, and the manner the routing chips 306 are wired to the I/O pins (not shown) of the interconnect board 204a or 204b. In alternate embodiments, identical interconnect boards, i.e. with same number of routing chips and same chip to pin wiring pattern, may be employed. Furthermore, "hybrid" interconnect boards, i.e. boards with logic as well as interconnect chips, may also be employed instead.

Figure 7:
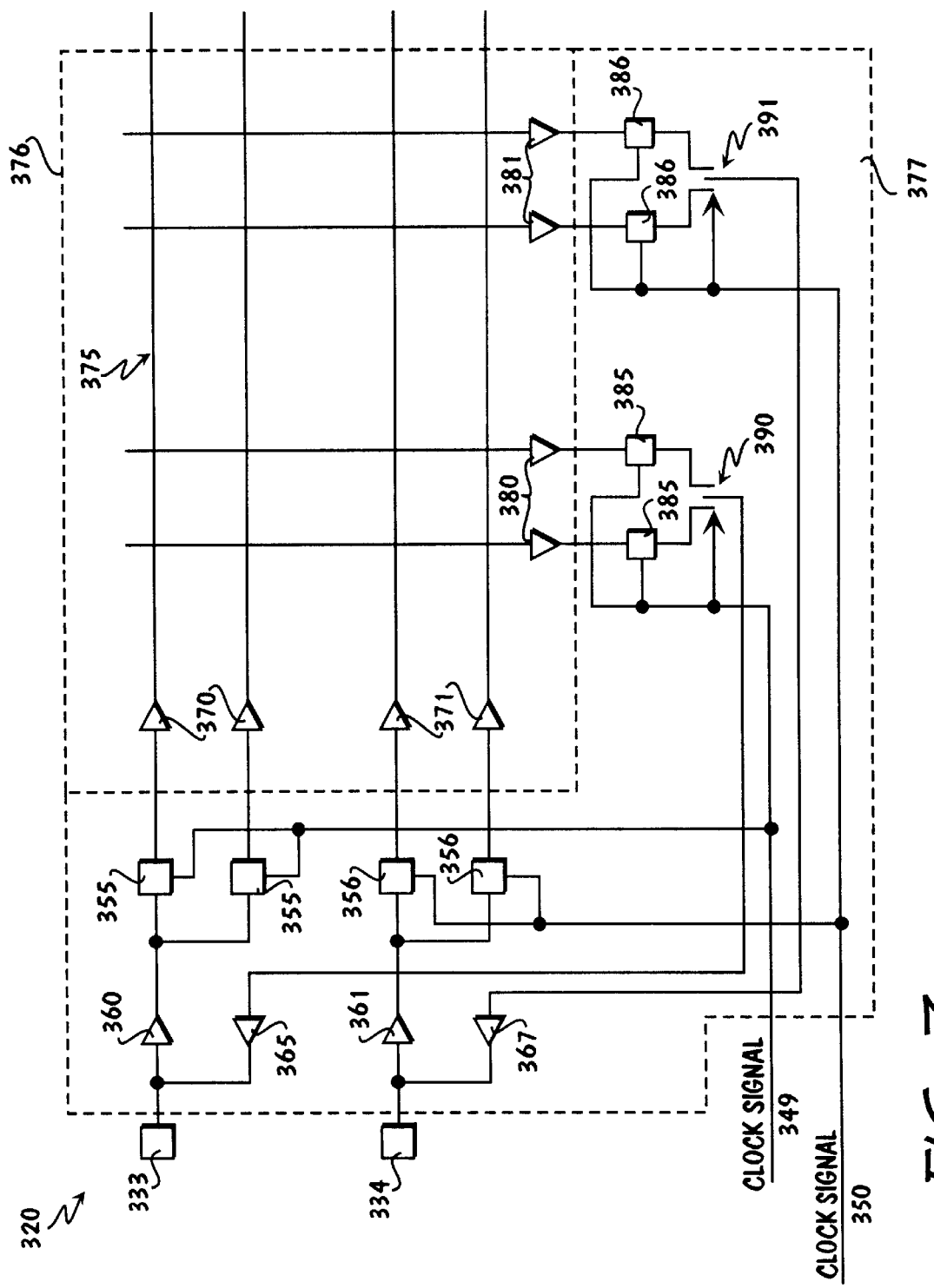
FIG. 7 is a block diagram illustrating one embodiment of a routing chip suitable for use in an interconnect board.

FIG. 7 illustrates one embodiment of a routing chip suitable for use in interconnect board 204. For the illustrated embodiment, routing chip 320 is of a multi-clocked type. As shown, routing chip 320 includes a "static" portion 376 and a "dynamic" portion 377 (the rest of routing chip 320). Static portion 376 includes grid 375, drivers 370 and 371, and drivers 380 and 381. Dynamic portion 377 includes a number of I/O pins. For ease of illustration, only two I/O pins 333 and 334 are shown. Additionally, dynamic portion 377 includes drivers 360, 361, 365 and 367, latches 355, 356, 385 and 386, and switches 390 and 391. Static portion 376 is not clocked, whereas dynamic portion 377 is controlled by a number of clock signals. For ease of explanation, two clock signals 349 and 350 are shown. Together, these elements enable emulation signal to be reconfigurably routed in multiple regional time domains. Regional time multiplexing, including routing chip 302, is the subject of contemporaneously filed U.S. patent application Ser. No. 09/404,920, entitled "A Regionally Time Multiplexed Emulation System", having at least a common inventor with the present invention. The application is hereby fully incorporated by reference. In alternate embodiments, other routing chips, including "hybrid" routing chips with logic functions, such as conventional FPGA may be employed instead.

Figure 8:
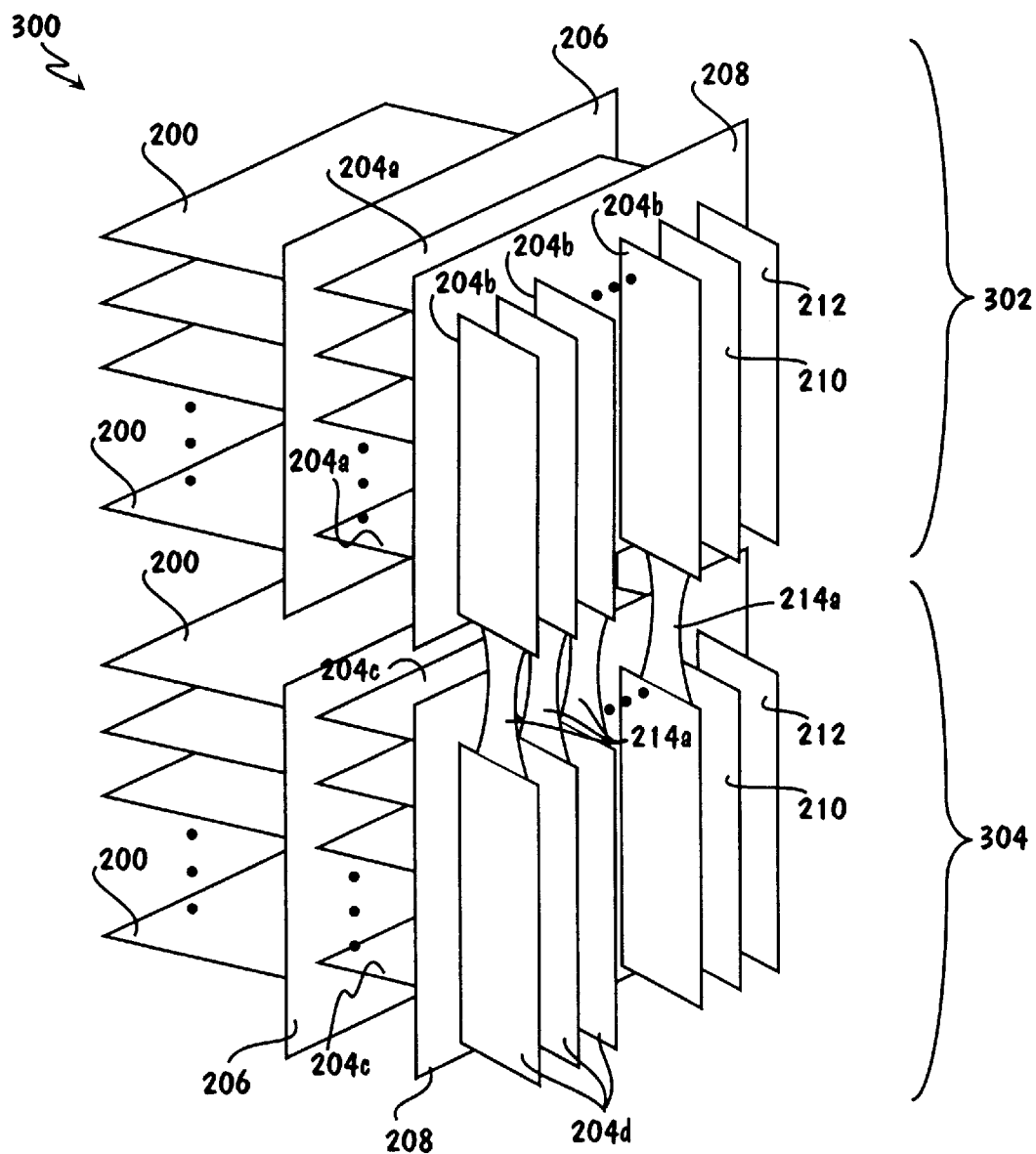
FIG. 8 is a perspective view illustrating a first expanded embodiment of the scalable emulator of the present invention.

FIG. 8 illustrates a first expanded embodiment of emulator 14 in accordance with the scaling teachings of the present invention. For the illustrated first expanded embodiment, emulator 14 is formed with basic embodiment 302 described earlier, and a substantial replicate 304 of basic embodiment 302, with basic embodiment 302 disposed at the top half of crate 300 and substantial replicate 304 disposed at the bottom half of crate 300. For the illustrated embodiment, substantial replicate 304 is the same as basic embodiment 302 except for interconnect boards 204d, which differ from interconnect boards 204b in that each of interconnect boards 204d for convenience purpose, contains wiring traces only and no routing chips nor expansion connectors. Otherwise the rest of the emulation resources are the same, including interconnect boards 204c, which are identical to interconnect boards 204a. In alternate embodiments, dissimilar number of logic boards as well as dissimilar logic boards may be employed. Likewise, dissimilar backplanes may also be employed. However, keeping scaling replicate 304 substantially similar to basic embodiment 302 has the advantage of keeping the half crate and full crate embodiments transparent to the circuit design partitioner of mapping software 22. Furthermore, keep the top half and the bottom half of emulator 14 substantially symmetric has the advantage of making it easier for the emulation resources to be shared by multiple circuit designs being "concurrently" emulated. Sharing emulation resources (i.e. concurrent emulation of multiple circuit designs) is the subject of contemporaneously filed, U.S. Pat. No. 6,473,726, entitled "Method and Apparatus for Concurrent Emulation of Multiple Circuit Designs on an Emulation System", having at least one common inventor with the present invention. The application is hereby fully incorporated by reference.

For the illustrated embodiment, interconnect boards 204b and 204d are interconnected using flex PCBs 214a. Each flex PCB 214a includes a number of wiring traces connecting I/O pins at one end to I/O pins at the other end of flex PCB 214a. Flex PCBs 214a advantageously provide a reliable way of interconnecting the two collections of emulation resources, but yet provide the flexibility of allowing for manufacturing misalignment between interconnect boards 204b of basic embodiment 302 and interconnect boards 204d of replicate 304.

Figure 9:
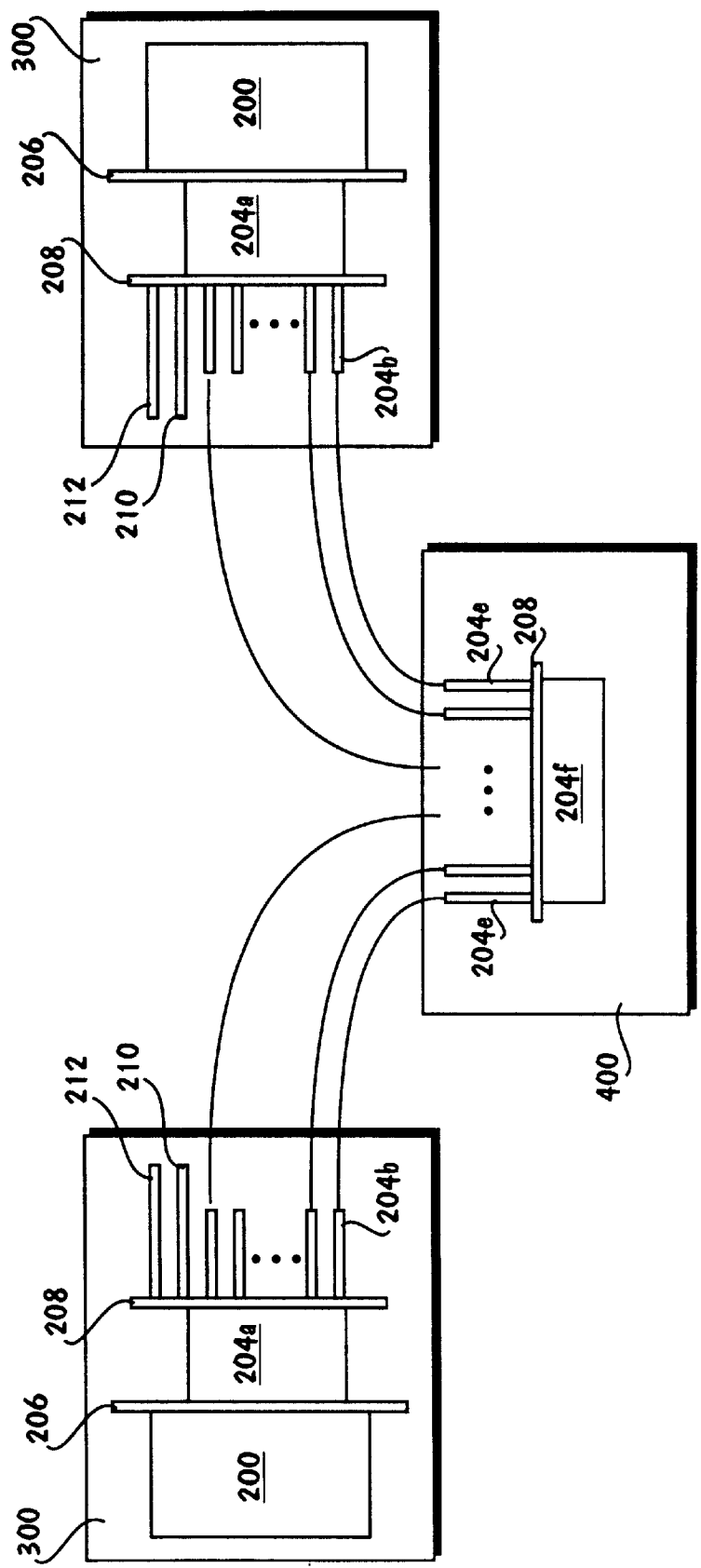
FIG. 9 is a top view illustrating a second expanded embodiment of the scalable emulator of the present invention.

FIG. 9 illustrates a second expanded embodiment of scalable emulator 14 in accordance with the scaling teachings of the present invention. For the illustrated second expanded embodiment, scalable emulator 14 is formed with two crates 300 in a back-to-back manner (or side-by-side, with the two crates rotated 90 degrees), using interconnect resources packed in interconnect crate 400. For the illustrated embodiment, the emulation resources of the two crates 300 are substantially identical. In alternate embodiments, crates with dissimilar emulation resources may be employed. However, as discussed earlier, keeping the emulation resources of the two crates 300 substantially similar to one another has the advantage of keeping the single crate and double crate embodiments transparent to the circuit design partitioner of mapping software 22. Furthermore, keeping the emulation resources of the two crates of scalable emulator 14 substantially symmetric has the advantage of making it easier for the emulation resources to be shared by multiple circuit designs being "concurrently" emulated.

For the illustrated embodiment, interconnect crate 400 includes interconnect boards 204e and 204f and backplane 208. For the illustrated embodiment, interconnect boards 204e differ from interconnect boards 204a and 204b, but interconnect boards 204f are identical to interconnect boards 204b. In alternate embodiments, identical interconnect boards or totally dissimilar interconnect boards may be employed. As discussed earlier, keeping the interconnect boards substantially similar has the advantage of keeping the single crate and double crate embodiments transparent to the circuit design partitioner of mapping software 22.

Figure 10:
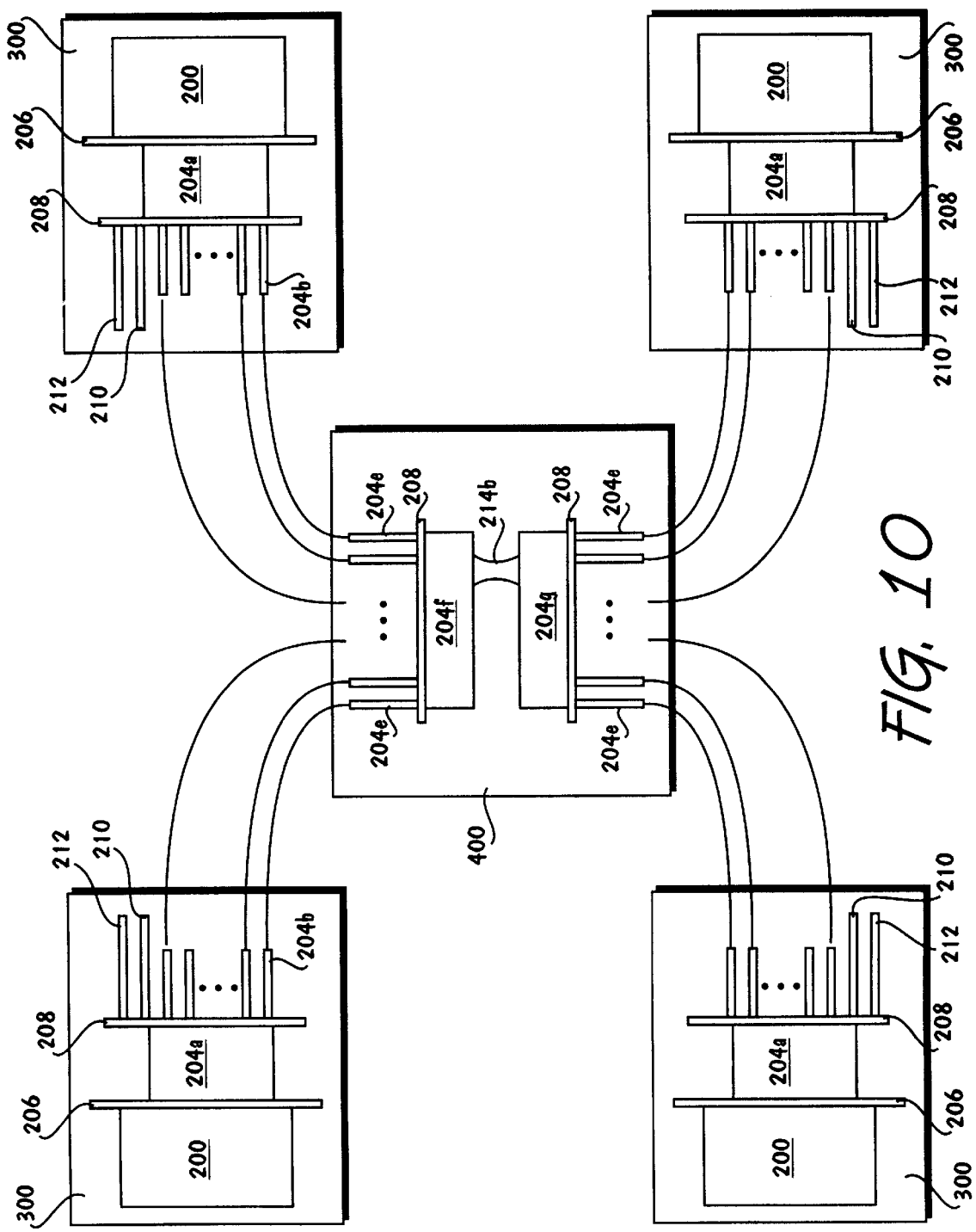
FIG. 10 is a top view illustrating a third expanded embodiment of the scalable emulator of the present invention.

FIG. 10 illustrates a third expanded embodiment of scalable emulator 14 in accordance with the scaling teachings of the present invention. For the illustrated third expanded embodiment, scalable emulator 14 is formed with four crates 300 in a quad manner, using interconnect resources packed in interconnect crate 400. For the illustrated embodiment, the emulation resources of the four crates 300 are substantially identical. In alternate embodiments, crates with dissimilar emulation resources may be employed. However, as discussed earlier, keeping the emulation resources of the four crates 300 substantially similar to one another has the advantage of keeping the two crate and four crate embodiments transparent to the circuit design partitioner of mapping software 22. Furthermore, keeping the emulation resources of the four crates of scalable emulator 14 substantially symmetric has the advantage of making it easier for the emulation resources to be shared by two or more circuit designs being "concurrently" emulated.

For the illustrated embodiment, interconnect crate 400 includes interconnect boards 204e, 204f and 204g, and backplanes 208. As described earlier, interconnect boards 204e differ from interconnect boards 204a and 204b, but interconnect boards 204f and 204g are identical to interconnect boards 204b and 204d described earlier. In alternate embodiments, identical interconnect boards or totally dissimilar interconnect boards may be employed, with advantages and disadvantages as set forth before.

While for ease of understanding, the present invention has been described in terms of the above illustrated embodiments, those skilled in the art will recognize that the invention is not limited to the embodiments described. In particular, the scaling may extend beyond 8× scaling (from half crate to 4 crate) illustrated, with additional granularity. In each case, the scaling may be advantageously effectuated with the transparency to the circuit design partitioning software, and the symmetry of the emulation resources maintained. Accordingly, the present invention can be practiced with modification and alteration within the spirit and scope of the appended claims. The description is thus to be regarded as illustrative instead of restrictive on the present invention.

Thus, a method and apparatus for scaling emulation system has been described.

What is claimed is:

1. An emulation system comprising
   (a) a first plurality of logic boards, wherein each logic board includes a first plurality of logic chips reconfigurable to emulate a first plurality of circuit elements of a circuit design; and
   (b) a first plurality of interconnect boards correspondingly coupled to the first plurality of logic boards, and a second plurality of interconnect boards orthogonally coupled to the first plurality of interconnect boards, wherein each of the first plurality of interconnect boards includes a first plurality of interconnect chips and each of the second plurality of interconnect boards includes a second plurality interconnect chips, and wherein the first and second plurality of interconnect chips of each of the first and second plurality of interconnect boards are reconfigurable to selectively interconnect the logic chips of different ones of the first plurality of logic boards, each of the second plurality of interconnect boards further including a first plurality of expansion connectors for facilitating expansion of the emulation system in one or more selected ones of expansion orientations.

2. The emulation system of claim 1, wherein the emulation system further comprises:
   (c) a second plurality of logic boards, wherein each logic board includes a second plurality of logic chips reconfigurable to emulate a second plurality of circuit elements of the circuit design; and
   (d) a third plurality of interconnect boards correspondingly coupled to the second plurality of logic boards, and a fourth plurality of interconnect boards orthogonally coupled to the third plurality of interconnect boards and correspondingly coupled to the second plurality of interconnect boards through selected ones of the first plurality of expansion connectors of each of the second plurality of interconnect boards, wherein each of the third plurality of interconnect boards includes a third plurality of interconnect chips, and wherein the third plurality of interconnect chips of each of the third plurality of interconnect boards are reconfigurable to cooperate with the first and second plurality of interconnect chips of each of the first and second plurality of interconnect boards to selectively interconnect the logic chips of different ones of the first and second plurality of logic boards.

3. The emulation system of claim 2, wherein each of the fourth plurality of interconnect boards further comprises a second plurality of expansion connectors, and the emulation system further comprises a first plurality of flex printed circuit boards (PCBs) correspondingly coupling selected ones of the first plurality of expansion connectors of each of the second plurality of interconnect boards to selected ones of the second plurality of expansion connectors of each of the fourth plurality of interconnect boards.

4. The emulation system of claim 2, wherein the first and second plurality of logic boards, and the first, second, third and fourth interconnect boards are packaged in a single cabinet with the first plurality of logic boards and the first and second interconnect boards occupying an upper portion of the cabinet, and the second plurality of logic boards and the third and fourth interconnect boards occupying a lower portion of the cabinet.

5. The emulation system of claim 2, wherein each of the fourth plurality of interconnect boards includes a fourth plurality of interconnect chips, and wherein the fourth plurality of interconnect chips of each of the fourth plurality of interconnect boards are also reconfigurable to cooperate with the first, second and third interconnect chips of each of the first, second and third plurality of interconnect boards to selectively interconnect the logic chips of different ones of the first and second plurality of logic boards.

6. The emulation system of claim 5, wherein the first and second plurality of logic boards, and the first, second, third and fourth interconnect boards are packaged in a single cabinet with the first plurality of logic boards and the first and second interconnect boards occupying an upper portion of the cabinet, and the second plurality of logic boards and the third and fourth interconnect boards occupying a lower portion of the cabinet.

7. The emulation system of claim 5, wherein the emulation system further comprises:
   (e) a fifth and a sixth plurality of interconnect boards correspondingly coupled to the second and fourth plurality of logic boards through the first and second plurality of expansion connectors of each of the second and fourth plurality of logic boards, and a seventh plurality of interconnect boards orthogonally coupled to the fifth and sixth plurality of interconnect boards, wherein each of the fifth, sixth and seventh plurality of interconnect boards includes a fifth, sixth and seventh plurality of interconnect chips, and wherein the fifth, sixth and seventh plurality of interconnect chips of each of the fifth, sixth and seventh plurality of interconnect boards are reconfigurable to cooperate with the first, second, third and fourth plurality of interconnect chips of each of the first, second, third and fourth plurality of the interconnect boards to selectively interconnect the logic chips of different ones of the first and second plurality of logic boards.

8. The emulation system of claim 7, wherein the first and second plurality of logic boards, and the first, second, third, fourth, fifth, sixth and seventh interconnect boards are packaged in three cabinets with the first plurality of logic boards and the first and second interconnect boards occupying a first cabinet, the second plurality of logic boards and the third and fourth interconnect boards occupying a second cabinet, and the fifth, sixth and seventh interconnect boards occupying a third cabinet.

9. The emulation system of claim 5, wherein the emulation system further comprises:
   (e) a fifth and a sixth plurality of interconnect boards correspondingly coupled to the second and fourth plurality of interconnect boards through the first and second plurality of expansion connectors of each of the second and fourth plurality of interconnect boards, a seventh and an eighth plurality of interconnect boards correspondingly coupled to each other and orthogonally coupled to the fifth and sixth plurality of interconnect boards respectively, wherein each of the fifth, sixth and seventh plurality of interconnect boards includes a fifth, sixth and seventh plurality of interconnect chips, and wherein the fifth, sixth and seventh plurality of interconnect chips of each of the fifth, sixth and seventh plurality of interconnect boards are reconfigurable to cooperate with the first, second, third and fourth plurality of interconnect chips of each of the first, second, third and fourth plurality of interconnect boards to selectively interconnect the logic chips of different ones of the first and second plurality of logic boards.

10. The emulation system of claim 9, wherein the first and second plurality of logic boards, and the first, second, third, fourth, fifth, sixth, seventh and eighth interconnect boards are packaged in three cabinets with the first plurality of logic boards and the first and second interconnect boards occupying a first cabinet, the second plurality of logic boards and the third and fourth interconnect boards occupying a second cabinet, and the fifth, sixth and seventh interconnect boards occupying a third cabinet.

11. The emulation system of claim 9, wherein
each of the seventh plurality of interconnect boards includes a third plurality of expansion connectors,
each of the eighth plurality of interconnect boards includes a fourth plurality of expansion connectors, and
the emulation system further comprises a plurality of flex printed circuit boards (PCBs) correspondingly coupling the third plurality of expansion connectors of each of the seventh plurality of interconnect boards to the fourth plurality of expansion connectors of each of the eighth plurality of interconnect boards.

12. The emulation system of claim 9, wherein each of the eighth plurality of interconnect boards includes an eighth plurality of interconnect chips, and wherein the eighth plurality of interconnect chips of each of the eighth plurality of interconnect boards are also reconfigurable to cooperate with the first, second, third, fourth, fifth, sixth and seventh interconnect chips of each of the first, second, third, fourth, fifth, sixth and seventh interconnect boards to selectively interconnect the logic chips of different ones of the first and second plurality of logic boards.

13. An apparatus comprising
(a) a first plurality of logic boards, a first plurality of interconnect boards corresponding coupled to the first plurality of logic boards, and a second plurality of interconnect boards orthogonally coupled to the first plurality of interconnect boards, wherein each of the second plurality of interconnect boards further includes a first plurality of expansion connectors; and
(b) a second plurality of logic boards, a third plurality of interconnect boards corresponding coupled to the second plurality of logic boards, and a fourth plurality of interconnect boards orthogonally coupled to the third plurality of interconnect boards and correspondingly coupled to the second plurality of interconnect boards through selected ones of the first plurality of expansion connectors of each of the second plurality of interconnect boards.

14. The apparatus of claim 13, wherein each of the fourth plurality of interconnect boards further comprises a second plurality of expansion connectors, and the emulation system further comprises a first plurality of flex printed circuit boards (PCBs) correspondingly coupling selected ones of the first plurality of expansion connectors of each of the second plurality of interconnect boards to selected ones of the second plurality of expansion connectors of each of the fourth plurality of interconnect boards.

15. The apparatus of claim 13, wherein the first and second plurality of logic boards, and the first, second, third and fourth interconnect boards are packaged in a single cabinet with the first plurality of logic boards and the first and second interconnect boards occupying an upper portion of the cabinet, and the second plurality of logic boards and the third and fourth interconnect boards occupying a lower portion of the cabinet.

16. The apparatus of claim 13, wherein the emulation system further comprises (c) a fifth and a sixth plurality of interconnect boards corresponding coupled to the second and fourth plurality of logic boards through the first and second plurality of expansion connectors of each of the second and fourth plurality of logic boards, and a seventh plurality of interconnect boards orthogonally coupled to the fifth and sixth plurality of interconnect boards.

17. The apparatus of claim 16, wherein the first and second plurality of logic boards, and the first, second, third, fourth, fifth, sixth and seventh interconnect boards are packaged in three cabinets with the first plurality of logic boards and the first and second interconnect boards occupying a first cabinet, the second plurality of logic boards and the third and fourth interconnect boards occupying a second cabinet, and the fifth, sixth and seventh interconnect boards occupying a third cabinet.

18. The apparatus of claim 13, wherein the emulation system further comprises (c) a fifth and a sixth plurality of interconnect boards corresponding coupled to the second and fourth plurality of interconnect boards through the first and second plurality of expansion connectors of each of the second and fourth plurality of interconnect boards, a seventh and an eighth plurality of interconnect boards correspondingly coupled to each other and orthogonally coupled to the fifth and sixth plurality of interconnect boards respectively.

19. The apparatus of claim 18, wherein the first and second plurality of logic boards, and the first, second, third, fourth, fifth, sixth, seventh and eighth interconnect boards are packaged in three cabinets with the first plurality of logic boards and the first and second interconnect boards occupying a first cabinet, the second plurality of logic boards and the third and fourth interconnect boards occupying a second cabinet, and the fifth, sixth and seventh interconnect boards occupying a third cabinet.

20. The apparatus of claim 18, wherein
each of the seventh plurality of interconnect boards includes a third plurality of expansion connectors,
each of the eighth plurality of interconnect boards includes a fourth plurality of expansion connectors, and
the emulation system further comprises a plurality of flex printed circuit boards (PCBs) correspondingly coupling the third plurality of expansion connectors of each of the seventh plurality of interconnect boards to the fourth plurality of expansion connectors of each of the eighth plurality of interconnect boards.

21. An apparatus comprising
(a) a first plurality of interconnect boards, and a second plurality of interconnect boards orthogonally coupled to the first plurality of interconnect boards, wherein each of the second plurality of interconnect boards further includes a first plurality of expansion connectors;
(b) a third plurality of interconnect boards, and a fourth plurality of interconnect boards orthogonally coupled to the third plurality of interconnect boards and correspondingly coupled to the second plurality of interconnect boards through selected ones of the first plurality of expansion connectors of each of the second plurality of interconnect boards, each of the fourth plurality of interconnect boards also having a second plurality of expansion connectors; and
(c) a first plurality of flex printed circuit boards (PCBs) correspondingly coupling selected ones of the first plurality of expansion connectors of each of the second plurality of interconnect boards to selected ones of the second plurality of expansion connectors of each of the fourth plurality of interconnect boards.

22. The apparatus of claim 21, wherein the first and second plurality of logic boards, and the first, second, third and fourth interconnect boards are packaged in a single cabinet with the first plurality of logic boards and the first and second interconnect boards occupying an upper portion of the cabinet, and the second plurality of logic boards and the third and fourth interconnect boards occupying a lower portion of the cabinet.

23. The apparatus of claim 21, wherein the emulation system further comprises (d) a fifth and a sixth plurality of interconnect boards corresponding coupled to the second and fourth plurality of logic boards through the first and second plurality of expansion connectors of each of the second and fourth plurality of logic boards, and a seventh plurality of interconnect boards orthogonally coupled to the fifth and sixth plurality of interconnect boards.

24. The apparatus of claim 23, wherein the first and second plurality of logic boards, and the first, second, third, fourth, fifth, sixth and seventh interconnect boards are packaged in three cabinets with the first plurality of logic boards and the first and second interconnect boards occupying a first cabinet, the second plurality of logic boards and the third and fourth interconnect boards occupying a second cabinet, and the fifth, sixth and seventh interconnect boards occupying a third cabinet.

25. The apparatus of claim 21, wherein the emulation system further comprises (d) a fifth and a sixth plurality of interconnect boards corresponding coupled to the second and fourth plurality of interconnect boards through the first and second plurality of expansion connectors of each of the second and fourth plurality of interconnect boards, a seventh and an eighth plurality of interconnect boards correspondingly coupled to each other and orthogonally coupled to the fifth and sixth plurality of interconnect boards respectively.

26. The apparatus of claim 25, wherein the first and second plurality of logic boards, and the first, second, third, fourth, fifth, sixth, seventh and eighth interconnect boards are packaged in three cabinets with the first plurality of logic boards and the first and second interconnect boards occupying a first cabinet, the second plurality of logic boards and the third and fourth interconnect boards occupying a second cabinet, and the fifth, sixth and seventh interconnect boards occupying a third cabinet.

27. A scalable emulation system comprising
a first plurality of logic boards, wherein each logic board includes a first plurality of logic chips reconfigurable to emulate a first plurality of circuit elements of a circuit design, and an intraboard interconnect network to interconnect logic chips within a given logic board;
a first plurality of interconnect boards correspondingly coupled to the first plurality of logic boards, wherein each of the first plurality of interconnect boards includes a first plurality of interconnect chips;
a second plurality of interconnect boards orthogonally coupled to the first plurality of interconnect boards, wherein each of the second plurality of interconnect boards includes a second plurality interconnect chips, and wherein the first and second plurality of interconnect chips of each of the first and second plurality of interconnect boards are reconfigurable to selectively interconnect the logic chips of different ones of the first plurality of logic boards at a logic-board level; and
a first plurality of expansion slots on the second plurality of interconnect boards for facilitating expansion of the emulation system in one or more selected ones of expansion orientations.

28. The emulation system of claim 27, wherein the emulation system further comprises:
a second plurality of logic boards, wherein each logic board includes a second plurality of logic chips reconfigurable to emulate a second plurality of circuit elements of the circuit design, and a second intraboard interconnect network to interconnect logic chips within a given logic board of the second plurality of logic boards;
a third plurality of interconnect boards correspondingly coupled to the second plurality of logic boards, wherein each of the third plurality of interconnect boards includes a third plurality of interconnect chips;
a fourth plurality of interconnect boards orthogonally coupled to the third plurality of interconnect boards and correspondingly coupled to the second plurality of interconnect boards through selected ones of the first plurality of expansion slots on the second plurality of interconnect boards, wherein the third plurality of interconnect chips of each of the third plurality of interconnect boards are reconfigurable to cooperate with the first and second plurality of interconnect chips of each of the first and second plurality of interconnect boards to selectively interconnect the logic chips of different ones of the first and second plurality of logic boards at the logic-board level.

29. The emulation system of claim 28, wherein each of the fourth plurality of interconnect boards further comprises a second plurality of expansion slots, and the emulation system further comprises a first plurality of flex printed circuit boards (PCBs) correspondingly coupling selected ones of the first plurality of expansion slots of each of the second plurality of interconnect boards to selected ones of the second plurality of expansion slots of each of the fourth plurality of interconnect boards.

30. The emulation system of claim 28, wherein each of the fourth plurality of interconnect boards includes a fourth plurality of interconnect chips, and wherein the fourth plurality of interconnect chips of each of the fourth plurality of interconnect boards are also reconfigurable to cooperate with the first, second and third plurality of interconnect chips of each of the first, second and third plurality of interconnect boards to selectively interconnect the logic chips of different ones of the first and second plurality of logic boards at the logic-board level.

31. The emulation system of claim 30, wherein each of the fourth plurality of interconnect boards further comprises a second plurality of expansion slots, and wherein the emulation system further comprises:
a fifth and a sixth plurality of interconnect boards correspondingly coupled to the second and fourth plurality of interconnect boards through the first and second plurality of expansion slots of each of the second and fourth plurality of interconnect boards, and a seventh plurality of interconnect boards orthogonally coupled to the fifth and sixth plurality of interconnect boards, wherein each of the fifth, sixth and seventh plurality of interconnect boards includes a fifth, sixth and seventh plurality of interconnect chips, and wherein the fifth, sixth and seventh plurality of interconnect chips of each of the fifth, sixth and seventh plurality of interconnect boards are reconfigurable to cooperate with the first, second, third and fourth plurality of interconnect chips of each of the first, second, third and fourth plurality of the interconnect boards to selectively interconnect the logic chips of different ones of the first and second plurality of logic boards at the logic-board level.

32. The emulation system of claim 30, wherein each of the fourth plurality of interconnect boards further comprises a second plurality of expansion slots, and wherein the emulation system further comprises:

a fifth and a sixth plurality of interconnect boards correspondingly coupled to the second and fourth plurality of interconnect boards through the first and second plurality of expansion slots of each of the second and fourth plurality of interconnect boards, a seventh and an eighth plurality of interconnect boards correspondingly coupled to each other and orthogonally coupled to the fifth and sixth plurality of interconnect boards respectively, wherein each of the fifth, sixth and seventh plurality of interconnect boards includes a fifth, sixth and seventh plurality of interconnect chips, and wherein the fifth, sixth and seventh plurality of interconnect chips of each of the fifth, sixth and seventh plurality of interconnect boards are reconfigurable to cooperate with the first, second, third and fourth plurality of interconnect chips of each of the first, second, third and fourth plurality of interconnect boards to selectively interconnect the logic chips of different ones of the first and second plurality of logic boards at the logic-board level.

33. The emulation system of claim 32, wherein each of the seventh plurality of interconnect boards includes a third plurality of expansion slots, each of the eighth plurality of interconnect boards includes a fourth plurality of expansion slots, and the emulation system further comprises a plurality of flex printed circuit boards (PCBs) correspondingly coupling the third plurality of expansion slots of each of the seventh plurality of interconnect boards to the fourth plurality of expansion slots of each of the eighth plurality of interconnect boards.

34. The emulation system of claim 32, wherein each of the eighth plurality of interconnect boards includes an eighth plurality of interconnect chips, and wherein the eighth plurality of interconnect chips of each of the eighth plurality of interconnect boards are also reconfigurable to cooperate with the first, second, third, fourth, fifth, sixth and seventh plurality of interconnect chips of each of the first, second, third, fourth, fifth, sixth and seventh plurality of interconnect boards to selectively interconnect the logic chips of different ones of the first and second plurality of logic boards at the logic-board level.

35. A scalable emulation system comprising a first plurality of logic boards, wherein each of the first plurality of logic boards includes a first plurality of logic chips and an intraboard interconnect network to interconnect logic chips within a given logic board, said first plurality of logic chips reconfigurable to emulate a first plurality of circuit elements of a circuit design;

a first plurality of interconnect boards correspondingly coupled to the first plurality of logic boards;

a second plurality of interconnect boards orthogonally coupled to the first plurality of interconnect boards, wherein each of the second plurality of interconnect boards further includes a first plurality of expansion slots;

a second plurality of logic boards, wherein each of the second plurality of logic boards includes a second plurality of logic chips and an intraboard interconnect network to interconnect logic chips within a given logic board, said second plurality of logic chips reconfigurable to emulate a first plurality of circuit elements of a circuit design;

a third plurality of interconnect boards correspondingly coupled to the second plurality of logic boards; and a fourth plurality of interconnect boards orthogonally coupled to the third plurality of interconnect boards and correspondingly coupled to the second plurality of interconnect boards through selected ones of the first plurality of expansion slots of each of the second plurality of interconnect boards, wherein the first, second, third, and fourth plurality of interconnect boards are reconfigurable to selectively interconnect the logic chips of different ones of the first and second plurality of logic boards at a logic-board level.

36. The emulation system of claim 35, wherein each of the fourth plurality of interconnect boards further comprises a second plurality of expansion slots, and the emulation system further comprises a first plurality of flex printed circuit boards (PCBs) correspondingly coupling selected ones of the first plurality of expansion slots of each of the second plurality of interconnect boards to selected ones of the second plurality of expansion slots of each of the fourth plurality of interconnect boards.

37. The emulation system of claim 35, wherein each of the fourth plurality of interconnect boards further comprises a second plurality of expansion slots, and wherein the emulation system further comprises a fifth and a sixth plurality of interconnect boards correspondingly coupled to the second and fourth plurality of logic boards through the first and second plurality of expansion slots of each of the second and fourth plurality of logic boards, and a seventh plurality of interconnect boards orthogonally coupled to the fifth and sixth plurality of interconnect boards.

38. The emulation system of claim 35, wherein each of the fourth plurality of interconnect boards further comprises a second plurality of expansion slots, and wherein the emulation system further comprises a fifth and a sixth plurality of interconnect boards correspondingly coupled to the second and fourth plurality of interconnect boards through the first and second plurality of expansion slots of each of the second and fourth plurality of interconnect boards, a seventh and an eighth plurality of interconnect boards correspondingly coupled to each other and orthogonally coupled to the fifth and sixth plurality of interconnect boards respectively.

39. The emulation system of claim 38, wherein each of the seventh plurality of interconnect boards includes a third plurality of expansion slots, each of the eighth plurality of interconnect boards includes a fourth plurality of expansion slots, and the emulation system further comprises a plurality of flex printed circuit boards (PCBs) correspondingly coupling the third plurality of expansion slots of each of the seventh plurality of interconnect boards to the fourth plurality of expansion slots of each of the eighth plurality of interconnect boards.

40. An interconnect network for an emulation system comprising:

a first plurality of interconnect boards;

a second plurality of interconnect boards orthogonally coupled to the first plurality of interconnect boards, wherein each of the second plurality of interconnect boards further includes a first plurality of expansion slots;

a third plurality of interconnect boards;

a fourth plurality of interconnect boards orthogonally coupled to the third plurality of interconnect boards and correspondingly coupled to the second plurality of interconnect boards through selected ones of the first plurality of expansion slots of each of the second plurality of interconnect boards, each of the fourth plurality of interconnect boards also having a second plurality of expansion slots; and a first plurality of flex printed circuit boards (PCBS) correspondingly coupling selected ones of the first plurality of expansion slots of each of the second plurality of interconnect boards to selected ones of the second plurality of expansion slots of each of the fourth plurality of interconnect boards, wherein the first, second, third, and fourth plurality of interconnect boards are reconfigurable to selectively interconnect logic boards at a logic-board level.

41. The interconnect network of claim 40, wherein the emulation system further comprises a fifth and a sixth plurality of interconnect boards correspondingly coupled to the second and fourth plurality of logic boards through the first and second plurality of expansion slots of each of the second and fourth plurality of logic boards, and a seventh plurality of interconnect boards orthogonally coupled to the fifth and sixth plurality of interconnect boards.

42. The interconnect network of claim 40, wherein the emulation system further comprises a fifth and a sixth plurality of interconnect boards correspondingly coupled to the second and fourth plurality of interconnect boards through the first and second plurality of expansion slots of each of the second and fourth plurality of interconnect boards, a seventh and an eighth plurality of interconnect boards correspondingly coupled to each other and orthogonally coupled to the fifth and sixth plurality of interconnect boards respectively.

* * * * *